United States Patent [19]

Samata et al.

[11] Patent Number: 5,116,780
[45] Date of Patent: May 26, 1992

[54] METHOD OF MANUFACTURING A SEMICONDUCTOR DEVICE HAVING IMPROVED CONTACT RESISTANCE CHARACTERISTICS

[75] Inventors: Shuichi Samata, Yokohama; Yoshiaki Matsushita, Kawasaki, both of Japan

[73] Assignee: Kabushiki Kaisha Toshiba, Lawasalo, Japan

[21] Appl. No.: 596,732

[22] Filed: Oct. 16, 1990

Related U.S. Application Data

[63] Continuation of Ser. No. 515,695, Apr. 26, 1990, abandoned, which is a continuation of Ser. No. 374,557, Jul. 3, 1989, abandoned, which is a continuation of Ser. No. 122,038, Nov. 17, 1987, abandoned.

[30] Foreign Application Priority Data

Nov. 19, 1986 [JP] Japan ................... 61-275801

[51] Int. Cl.$^5$ ............................................. H01L 21/20
[52] U.S. Cl. ................................... 437/89; 437/913; 437/156; 437/160; 437/189
[58] Field of Search .................... 357/59, 23.9, 23.9, 357/59, 54, 91; 437/89, 99, 34, 913, 160, 161

[56] References Cited

U.S. PATENT DOCUMENTS

| | | | |
|---|---|---|---|
| 4,011,105 | 3/1977 | Paivinen et al. | 357/59 |
| 4,309,224 | 1/1982 | Shibata | 357/23.9 |
| 4,355,454 | 10/1982 | Tasch et al. | |
| 4,364,078 | 12/1982 | Smith et al. | 357/59 |
| 4,403,394 | 9/1983 | Shepard et al. | 357/23.9 |
| 4,518,981 | 5/1985 | Schlupp | 357/15 |
| 4,636,834 | 1/1987 | Shephard | 357/59 |
| 4,710,241 | 12/1987 | Komatsu | 357/34 |
| 4,737,835 | 4/1988 | Ariizumi et al. | 357/23.9 |
| 4,746,219 | 5/1988 | Holloway et al. | 357/23.11 |
| 4,780,427 | 10/1988 | Sakai et al. | 357/34 |
| 4,782,037 | 11/1988 | Tomozawa et al. | 437/56 |
| 4,824,799 | 4/1989 | Komatsu | 437/89 |

FOREIGN PATENT DOCUMENTS

| | | | |
|---|---|---|---|
| A0018175 | 10/1980 | European Pat. Off. | |
| 0037829 | 3/1982 | Japan | 437/89 |
| 0186051 | 9/1985 | Japan | 437/913 |
| 0195972 | 10/1985 | Japan | 437/913 |
| 0245657 | 10/1987 | Japan | 437/40 |

OTHER PUBLICATIONS

Patent Abstracts of Japan, vol. 9, No. 212 Aug. 1985, Semconductor Device No. JP 60-74675 (A).

L. Jastrzebski, "Silicon CVD for SOI: Principles and Possible Applications," *Solid State Technology*, pp. 239-243, Sep. 1984.

K. Tanno et al., "Selective Silicon Epitaxy Using Reduced Pressure Technique," *Japanese Journal of Applied Physics*, vol. 21, No. 9, L564-L566, Sep. 1982.

*Primary Examiner*—Brian E. Hearn
*Assistant Examiner*—Michael Trinh
*Attorney, Agent, or Firm*—Finnegan, Henderson, Farabow, Garrett and Dunner

[57] ABSTRACT

A multi-layered insulation film of non-doped CVD $SiO_2$ (silicon dioxide) film and BPSG (boro-phosphosilicate glass) film is formed on a silicon substrate. Films have a contact hole exposing impurity diffused region formed in silicon substrate. A semiconductor layer is formed in the contact hole. An Al (aluminum) film is formed on the semiconductor layer. The semiconductor layer contacts the BPSG film so that the contact resistance between the semiconductor layer and the Al (aluminum) film can be reduced, and a variation of the contact resistance between respective semiconductor devices can also be reduced.

8 Claims, 3 Drawing Sheets

METHOD OF MANUFACTURING A SEMICONDUCTOR DEVICE HAVING IMPROVED CONTACT RESISTANCE CHARACTERISTICS

This application is a continuation of application Ser. No. 07/515,695 filed Apr. 26, 1990, which is a continuation of abandoned application Ser. No. 07/374,557, filed Jul. 3, 1989, which is a continuation of abandoned application Ser. No. 07/122,038, filed Nov. 17, 1987.

BACKGROUND OF THE INVENTION

This invention relates to a semiconductor device and, more particularly, to an improvement on a contact resistance characteristic between an electrode layer and a semiconductor layer.

With the recent trend for reducing the size and increasing the integration density of integrated circuit elements, great importance has been attached to techniques of forming a conductive layer, e.g., a silicon layer, in contact holes. As a technique for forming a silicon layer in a contact hole, a selective epitaxial growth process has heretofore been used.

FIG. 1 is a sectional view showing a prior art MOS transistor. In the Figure, reference numeral 1 designates a semiconductor substrate of p-conductivity type; numeral 2 is a gate insulation film; numeral 3, a gate electrode; numeral 4, a field oxide film, numeral 5, a non-doped CVD (chemical vapor deposition) $SiO_2$ (silicon dioxide) film which is formed by CVD process and is not doped with an impurity; numeral 6, a BPSG (boro-phospho-silicate glass) film; numeral 7, a single crystal silicon layer of n-conductivity type; and numerals 8 and 9 are source and drain layers of an n-conductivity type. Numerals 10 and 11 designate respective source and drain electrodes made of aluminum. Silicon layer 7 is formed by the epitaxial growth process. A feature of this structure resides in that BPSG film 6 and n-type silicon layer 7 are not in contact with each other. In the MOS transistor of the above structure, however, the contact resistance between n-type silicon layer 7 and each of aluminum lead layers 10 and 11 on silicon layer 7 fluctuates greatly among individual MOS transistors.

In the above circumstances, it has been desired to reduce fluctuations of the contact resistance between silicon layer 7 and each of aluminum lead layers 10 and 11 with individual elements Also, with the above structure the contact resistance between n-type silicon layer 7 and each aluminum lead layer is high, so that non-ohmic contact characteristics result. More specifically, to provide for ohmic contact characteristics of the contact between n-type silicon layer 7 and the aluminum lead layer by impurity concentration of silicon layer 7 has to be set to be $1 \times 10^{20}$ $cm^{-3}$ or above. In order to increase the impurity concentration of a silicon layer formed in a contact hole by the selective epitaxial growth process, it is necessary to increase the concentration of the doping gas, e.g., $PH_3$, $AsH_3$ or $B_2H_6$. However, increasing the concentration of the doping gas leads to a different problem in that the characteristics of the silicon layer growth are changed. Thus, it has been desired to provide for ohmic contact characteristics of the contact between silicon layer 7 and the aluminum lead layer by reducing the contact resistance therebetween without changing the growth characteristic of silicon layer 7.

Further, while ohmic contact characteristics are obtained between a p-type silicon layer and an aluminum lead layer, the operation speed can be further increased by reducing the contact resistance. For this reason, it has been desired to reduce the contact resistance in the case where a p-type silicon layer is used.

SUMMARY OF THE INVENTION

An object of the invention is to provide a semiconductor device, in which the contact resistance between a silicon layer and a metal lead layer is low and the contact characteristics is ohmic, to reduce contact resistance fluctuations with individual semiconductor elements, even when the silicon layer is formed in a contact hole using a low concentration doping gas.

According to the present invention, there is provided a semiconductor device comprising:
- a semiconductor body of a first conductivity type;
- an impurity-diffused region of a second conductivity type formed in said semiconductor body;
- an insulation film formed on said semiconductor body comprising a silicon dioxide film having an impurity of said second conductivity type, the insulation film having a contact hole formed on said impurity diffused region;
- a semiconductor layer of said second conductivity type formed in said contact hole of said insulation film, the semiconductor layer contacting said silicon dioxide film: and
- a conductor layer formed on said semiconductor layer.

DETAILED DESCRIPTION OF THE PREFERRED EMBODIMENTS

Figure 1:
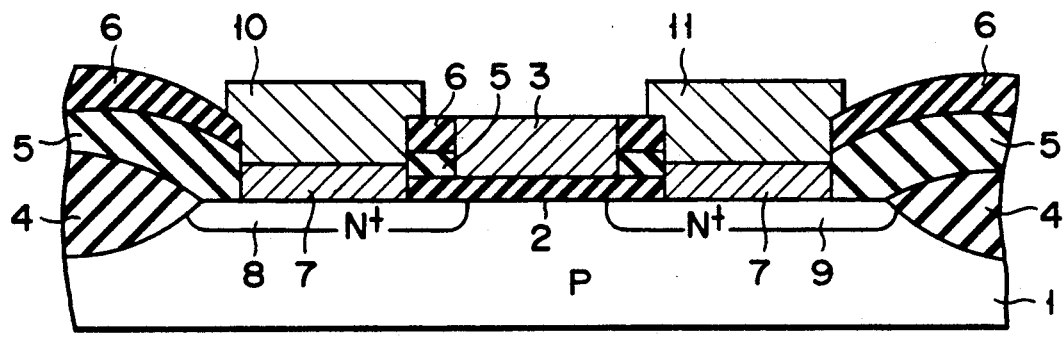
FIG. 1 is a sectional view showing a prior art semiconductor device.
Figure 2:
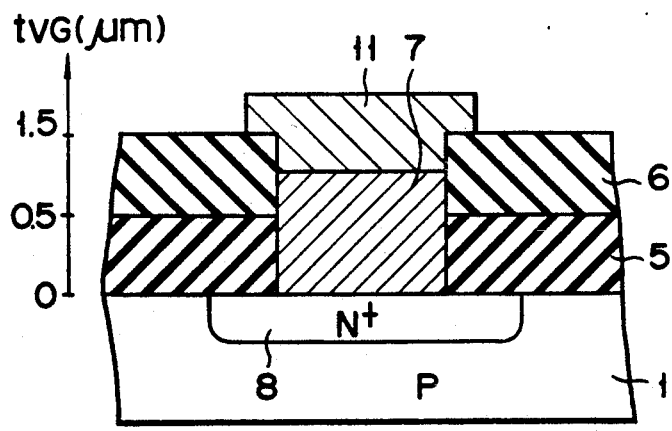
FIG. 2 is a sectional view showing an embodiment of the semiconductor device according to the invention.

Now, preferred embodiments of the invention will be described with reference to the drawings. FIG. 2 is a sectional view showing an embodiment of the semiconductor device according to the invention. Parts corresponding to those in the prior art structure of FIG. 1 are designated by the same reference numerals.

N+-conductivity type impurity diffusion region 8 is formed in a surface region of silicon substrate or well region 1 of a p-conductivity type. $SiO_2$ (silicon dioxide) film 5, which is not doped with any impurity, is formed on substrate 1 by a CVD (chemical vapor deposition) process. The $SiO_2$ film is hereinafter referred to as "non-doped CVD $SiO_2$ film". BPSG (boro-phospho-silicate glass) film 6 is formed on $SiO_2$ film 5. A contact hole is formed in $SiO_2$ film 5 and BPSG film 6 to expose impurity diffused region 8. Single crystal silicon layer 7 of an n-conductivity type is formed in the contact hole by the selective epitaxial growth process. Aluminum lead layer 11 is formed on silicon layer 7.

Figure 3:
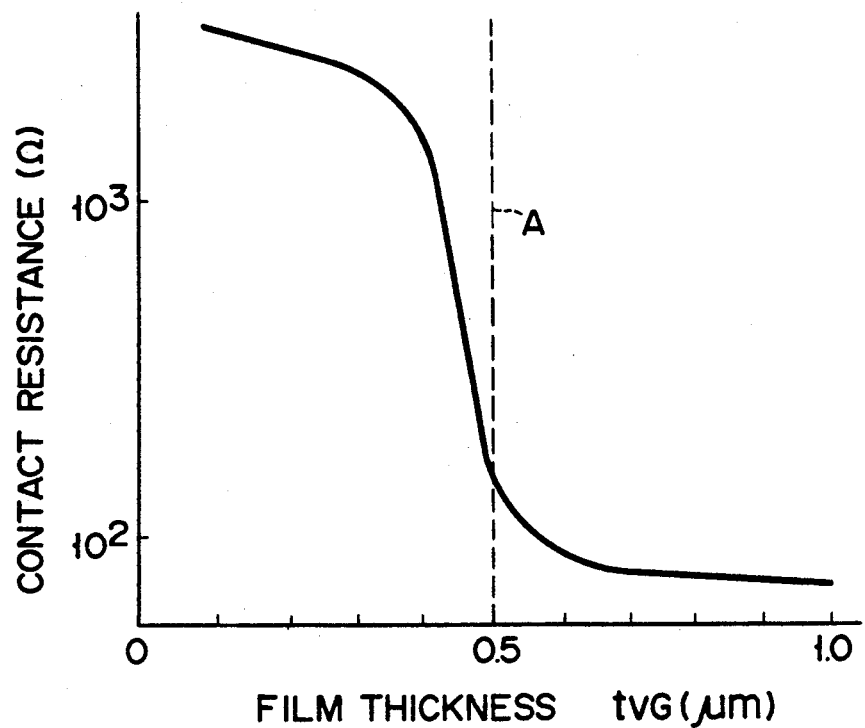
FIG. 3 is a graph showing a contact characteristic between a silicon layer and an Ag electrode layer in the embodiment shown in FIG. 2.

FIG. 3 shows a characteristic relationship curve of a film thickness of silicon layer 7 to the contact resistance formed between silicon layer 7 and aluminum lead layer 11 of a semiconductor device shown in FIG. 2, in which insulating film 6 is a BPSG (boro-phospho-silicate glass) film, $SiO_2$ film 5 is a non-doped CVD $SiO_2$ film, single crystal silicon layer 7 is formed by the selective epitaxial growth process and contains $2 \times 10^{19}$ cm$^{-3}$ of phosphorus, and the contact hole is a 1 μm-square hole. In the Figure, reference character A shows the position of the interface between $SiO_2$ film 5 and BPSG film 6. As is obvious from this characteristic curve, the contact resistance is too low to present any problem in practice even when the impurity concentration of epitaxially grown silicon layer 7 is set to be as low as $2 \times 10^{19}$ cm$^{-3}$.

The reason for the low contact resistance is thought to be that, since silicon layer 7 contacts or is contiguous to BPSG film 6, the p-type impurity of BPSG film 6 is diffused into silicon layer 7 to increase the impurity concentration in the surface region of silicon layer 7. It will be seen from the characteristics of FIG. 3 that BPSG film 6 may be made continuous to epitaxially grown silicon layer 7 to obtain practically sufficient low contact resistance. The impurity concentration of epitaxially grown silicon layer 7 is desirably $5 \times 10^{18}$ cm$^{-3}$ or above. If the impurity concentration is below the value noted above, the contact resistance is practically too high even if impurities are diffused from BPSG film 6 into silicon layer 7.

In the FIG. 2 embodiment, n$^+$-type impurity diffused region 8 is used. However, a p-type impurity diffused region can be used. In this case, the silicon substrate or well region is of n-conductivity type, and the epitaxially grown silicon layer is of p-conductivity type. Also, in this case, BSG (boro-silicate glass) or BAs SG (boro-arseno-silicate glass) may be used as insulation film 6. The impurity concentration of the epitaxially grown p-type silicon layer is desirably $5 \times 10^{18}$ cm$^{-3}$ or above.

Figure 4:
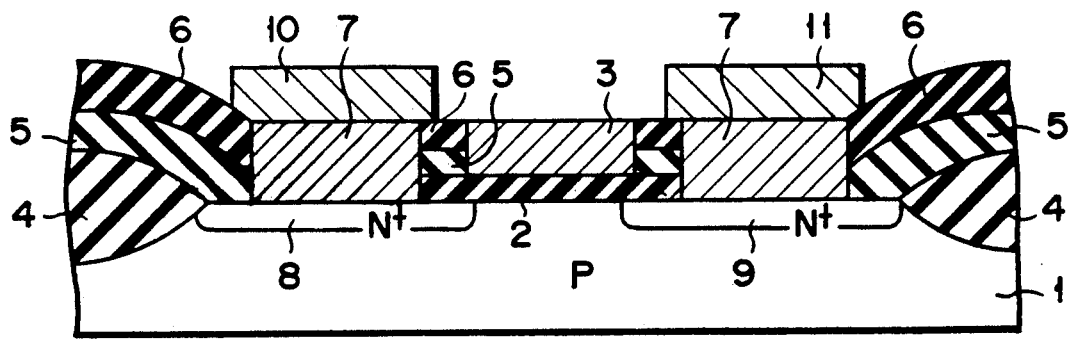
FIG. 4 is a sectional view showing another embodiment of the semiconductor device according to the invention.

FIG. 4 is a sectional view showing another embodiment of the semiconductor device according to the invention. This device corresponds to the prior art device shown in FIG. 1.

Field oxide film 4 of a predetermined pattern is formed on silicon substrate or well region 1 of a p-conductivity type. Impurity-diffused regions 8 and 9 of an n$^+$-conductivity type are formed in the element forming regions of silicon substrate 1, which are defined by the predetermined pattern of field oxide film 4. Impurity-diffused regions 8 and 9 form source and drain regions, respectively. $SiO_2$ film 5 is formed on field oxide film 4 and gate insulation film 2. $SiO_2$ film 5 is formed by CVD (chemical vapor deposition) process and undoped with any impurities. BPSG film 6 is formed on $SiO_2$ film 5. Contact holes are formed in $SiO_2$ film 5 and BPSG film 6. The contact holes lead to source region 8 and drain region 9. Single crystal silicon layers 7 are formed in the contact holes leading to source region 8 and drain region 9. Single crystal silicon layers 7 are formed by a selective epitaxial growth process. Source electrode 10 made of aluminum is formed on silicon layer 7 on source region 8. Drain electrode 11 made of aluminum is formed on silicon layer 7 on drain region 9. Silicon layers 7 contact or are contiguous to BPSG film 6. A further hole is formed in $SiO_2$ film 4 and BPSG film 6, which leads to gate insulation film 2. Gate electrode 3 made of aluminum is formed in the hole.

A feature of this embodiment, like the embodiment of FIG. 2, resides in that silicon layer 7 and BPSG film 6 are contiguous to each other. $SiO_2$ film 5 has an effect of preventing the diffusion of boron (B) and phosphorus (P) in BPSG film 6 into semiconductor substrate 1.

In the FIG. 4 embodiment, n$^+$-type impurity diffused regions 8 and 9 are used. However, p-type impurity diffused regions can be used. In this case, the silicon substrate or well region is of n-conductivity type, and the epitaxially grown silicon layers are of p-conductivity type.

Now, examples of the invention will be given.

EXAMPLE 1

A 256K SRAM (static random access memory) having an n-channel MOS transistor structure shown in FIG. 4 was trial manufactured under the 1.2 μm design rule (a minimum contact hole size). N-type silicon layers with a thickness of 1 μm and a phosphorus concentration of $4 \times 10^{19}$ cm$^{-3}$ were formed, using a reactive gas of $H_2$, $SiH_2Cl_2$, HCl and $PH_3$, in contact holes for exposing the source and drain regions of the n-channel MOS transistor, by a selective epitaxial growth process. Then, an aluminum lead layer was formed on the n-type silicon layers on the source and drain regions. Interlayer insulation films 5 and 6 were constituted by non-doped CVD $SiO_2$ film 5 and BPSG film 6. The thickness of BPSG film 6 and $SiO_2$ film 5 was set to 0.5 μm.

EXAMPLE 2

The same SRAM as Example 1 was trial manufactured except that the phosphorus concentration of silicon layer 7 was set to $3 \times 10^{18}$ cm$^{-3}$.

EXAMPLE 3

The same SRAM as Example 1 was trial manufactured except that $AsH_3$ was used as the doping gas and that the As concentration in silicon layer 7 was set to $4 \times 10^{19}$ cm$^{-3}$.

EXAMPLE 4

The same SRAM as Example 1 was trial manufactured except that interlayer insulation films 5 and 6 were non-doped CVD $SiO_2$ film 5 and PSG film 6 and the thickness of $SiO_2$ film 5 and PSG film 6 was set to 0.5 μm.

EXAMPLE 5

The same SRAM as Example 1 was trial manufactured except that the MOS transistor was a p-type MOS transistor, a reactive gas composed of $H_2$, $SiH_2Cl_2$, HCl and $B_2H_6$ was used, the silicon layer was a p-type silicon layer formed by the selective epitaxial growth process and having a thickness of 1 μm and a boron concentration of $4 \times 10^{19}$ cm$^{-3}$, interlayer insulation films 5 and 6 were non-doped CVD $SiO_2$ film 5 and BSG film 6, and the thickness of CVD $SiO_2$ film 5 and BSG film 6 was set to 0.5 μm.

CONTRAST EXAMPLE 1

The same SRAM as Example 1 was trial manufactured except that the thickness of silicon layer 7 was set to 0.4 μm.

CONTRAST EXAMPLE 2

The same SRAM as Example 1 was trial manufactured except that interlayer insulation films 5 and 6 were non-doped CVD $SiO_2$ film 5 and BSG film 6, and the thickness of CVD $SiO_2$ film 5 and BSG film 6 was set to 0.5 μm.

CONTRAST EXAMPLE 3

The same SRAM as Example 5 was trial manufactured except that the thickness of the silicon layer was set to 0.4 μm.

The operating characteristics of the individual examples of 256K SRAMs were compared to those of the contrast examples. In Examples 1 to 5, all 256K SRAMs were operated. In Contrast Examples 1 and 3, some 256K SRAMs were operated, but others were not. In Contrast Example 2, no 256K SRAMs were operated.

In contrast Examples 1 and 3 of 256K SRAMs, the contact resistance between the silicon layer and aluminum lead layer fluctuated greatly among the individual MOS transistors. In contrast Example 2 of 256K SRAMs, the contact resistance was high in all the MOS transistors.

The reason for the fluctuations of the contact resistance among the individual MOS transistors in contrast Examples 1 and 3 of 256K SRAMs is thought to be due to the lack of uniformity of the film thickness of silicon layer 7 of the individual MOS transistors. More specifically, in contrast Example 1 of 256K SRAMs, the contact resistance is low in the MOS transistors where silicon layer 7 is contiguous to BPSG film 6, while it is high in the MOS transistors where silicon layer 7 is not contiguous to BPSG film 6.

In contrast Example 1 of the SRAM, the MOS transistors where silicon layer 7 are contiguous to BPSG film 6 are operated owing to low contact resistance, but the MOS transistors where the two layers are not contiguous are not operated because of high contact resistance. The same thing can be said of contrast Example 3 of the SRAM. That is, the MOS transistors where silicon layer 7 is contiguous to BSG film 6 are operated owing to low contact resistance, but the MOS transistors where the two layers are not contiguous are not operated because of high contact resistance.

The reason that all the SRAMs in contrast Example 2 fail to operate is thought to be due to high contact resistance, since silicon layer 7 is not contiguous to BPSG film 6 in all the MOS transistors.

In Examples 1 to 5, all SRAMs were operated normally. More specifically, with each SRAM MOS transistor the contact resistance was low, and contact resistance fluctuations were low among the individual MOS transistors.

In Example 2 of the SRAM, the contact resistance of each MOS transistor is approximately three times that of each SRAM transistor in Examples 1, 3 and 4, so that the operation speed is lower than that of Examples 1, 3 and 4.

It is seen from Example 2 that more superior operation characteristics can be obtained by setting the impurity concentration of the silicon layer to be $4 \times 10^{18}$ cm$^{-3}$ or above. Further, it will be seen that the invention is applicable not only to the n-type contact but also to the p-type contact as shown in Example 5.

Figure 5:
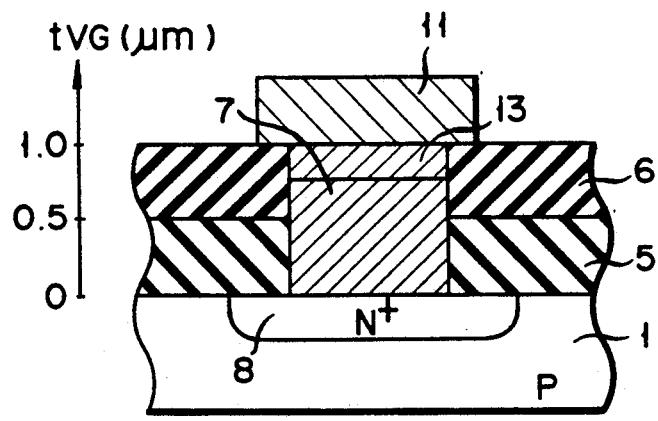
FIGS. 5 and 6 are sectional views showing further embodiments of the semiconductor device according to the invention.

FIG. 5 is a sectional view showing a further embodiment of the semiconductor device of the invention. In this embodiment, molybdenum (Mo) layer 13 is formed between single crystal silicon layer 7 and aluminum lead layer 11. Molybdenum has a low work-function, and the contact resistance between silicon layer 7 and aluminum lead layer 11 is small. Thus, the ohmic resistance characteristic is improved. Titanium, tungsten or tantalum may be used in stead of molybdenum. An alloy of titanium and tungsten may also used. Molybdenum silicide, tungsten silicide, titanium silicide, or tantalum silicide may be used. Titanium nitride may also be used. These materials have low work-functions, and the contact resistance between silicon layer 7 and aluminum lead layer 11 is made low. Thus, the ohmic resistance characteristic is improved.

Figure 6:
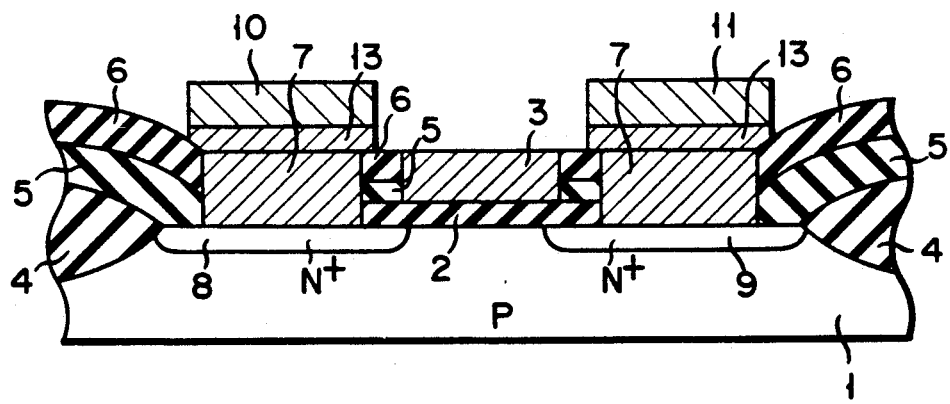

FIG. 6 is a sectional view showing a still further embodiment of the semiconductor device of the invention. Also in this embodiment, molybdenum layers 13 are formed between single crystal silicon layer 7 and each of aluminum lead layers 10 and 11. Also in this embodiment, the materials mentioned above may be used in place of molybdenum. These materials have low work-functions, and the contact resistance between silicon layer 7 and each of aluminum lead layers 10 and 11 is made low. Thus, the ohmic resistance characteristic is improved.

The above examples are by no means limitative, and the invention has various other applications. For example, when silicon layer 7 is of an n-type, silicon oxide layer 6 is not limited to BPSG or PSG, but it is possible to use AsSG, BAsSG, PAsSG and BPAsSG. Further, where the silicon layer is of a p-type, either BSG or BAsSG may be used as silicon oxide layer 6.

As has been described in the foregoing, according to the invention, it is possible to provide a semiconductor device in which the contact resistance of the contact between a semiconductor layer formed in a contact hole and a metal lead layer formed on the semiconductor layer and also fluctuations of the contact resistance are low so that improved operation characteristics can be obtained.

What is claimed is:

1. A method of manufacturing a semiconductor device comprising:

forming an impurity diffused region of n-conductivity type in a silicon substrate comprising a semiconductor body of p-conductivity type;

forming a superposed insulation film structure comprising a first insulation layer and a second insulation layer comprising a film of a component selected from the group consisting of phospho-silicate glass, arseno-silicate glass, boro-phospho-silicate glass, boro-arseno-silicate glass, phospho-arseno-silicate glass, and boro-phospho-arseno-silicate glass, said first insulation layer being formed on said semiconductor body, and said second insulation layer being formed on said semiconductor body, and said second insulation layer being formed on said first insulation layer and containing impurities of n-conductivity type;

forming in said first and second insulation layers a continuous contact hole opening onto said impurity diffused region;

forming a single crystalline semiconductor silicon layer of said n-conductivity type in said contact hole of said first and second insulation layers by an epitaxial growth process, with the single crystalline semiconductor silicon layer contacting said second insulation layer to diffuse said impurities from said second insulation layer into said single crystalline semiconductor silicon layer during said epitaxial growth process to increase an impurity concentration in a surface region thereof while said first insulation layer prevents impurity diffusion into the silicon substrate; and forming a conductive layer on said semiconductor silicon layer.

2. A method of manufacturing a semiconductor device according to claim 1, in which a concentration of impurity of said single crystal semiconductor layer is higher than $4 \times 10^{18}$ cm$^{-3}$.

3. A method of manufacturing a semiconductor device according to claim 1, in which said conductive layer is an aluminum layer.

4. A method of manufacturing a semiconductor device according to claim 1, further comprising a step of forming a second conductive layer between said single crystalline semiconductor silicon layer and said conductive layer.

5. A method of manufacturing a semiconductor device according to claim 4, in which said second conductive layer is a layer formed of a component selected from the group consisting of molybdenum, titanium, tungsten and tantalum.

6. A method of manufacturing a semiconductor device according to claim 4, in which said second conductive layer is a layer formed of an alloy titanium and molybdenum.

7. A method of manufacturing a semiconductor device according to claim 4, in which said second conductive layer is a layer formed of a component selected from the group consisting of molybdenum silicide, titanium silicide, tungsten silicide and tantalum silicide.

8. A method of manufacturing a semiconductor device according to claim 4, in which said second conductive layer is a layer formed of titanium nitride.

* * * * *